US010684591B1

(12) United States Patent
Burke et al.

(10) Patent No.: US 10,684,591 B1
(45) Date of Patent: Jun. 16, 2020

(54) OPTICAL RUBIDIUM ATOMIC FREQUENCY STANDARD

(71) Applicant: Government of the United States, as represented by the Secretary of the Air Force, Kirtland AFB, NM (US)

(72) Inventors: John H. Burke, Kirtland AFB, NM (US); Nathan D. Lemke, Albuquerque, NM (US); Gretchen R. Phelps, Albuquerque, NM (US); Kyle W. Martin, Albuquerque, NM (US); Benjamin K. Stuhl, Albuquerque, NM (US)

(73) Assignee: THE GOVERNMENT OF THE UNITED STATES OF AMERICA AS REPRESENT BY THE SECRETARY OF THE AIR FORCE, Washington, DC (US)

( * ) Notice: Subject to any disclaimer, the term of this patent is extended or adjusted under 35 U.S.C. 154(b) by 33 days.

(21) Appl. No.: 16/056,342

(22) Filed: Aug. 6, 2018

Related U.S. Application Data

(60) Provisional application No. 62/690,651, filed on Jun. 27, 2018.

(51) Int. Cl.
*G04F 5/14* (2006.01)
*H01S 5/14* (2006.01)
(Continued)

(52) U.S. Cl.
CPC .............. *G04F 5/14* (2013.01); *G02F 1/365* (2013.01); *G04F 5/145* (2013.01); *H01S 3/005* (2013.01); *H01S 3/0085* (2013.01); *H01S 3/13* (2013.01); *H01S 3/1305* (2013.01); *H01S 5/142* (2013.01); *H03L 7/26* (2013.01); *G02F 2203/56* (2013.01)

(58) Field of Classification Search
CPC ........ G02F 1/353; G02F 1/0121; G02F 1/365; G02F 2/02; G02F 2/002; G02F 2203/56; H01S 3/0078; H01S 3/005; H01S 3/13; H01S 3/1305; H01S 3/0085; H01S 5/0687; H01S 5/0078; H01S 5/0085; H01S 5/142;
(Continued)

(56) References Cited

U.S. PATENT DOCUMENTS 7,323,941 B1 1/2008 Happer et al.
7,468,637 B2 12/2008 Braun et al.
(Continued)

OTHER PUBLICATIONS

Erickson, C., et al., "Progress Towards Building Optical Clocks for Land and Space at AFRL," Proceedings of the 46th Annual Precise Time and Time Interval Systems and Applications Meeting, Boston, Massachusetts, Dec. 2014, pp. 149-153.
(Continued)

*Primary Examiner* — Arnold M Kinkead
(74) *Attorney, Agent, or Firm* — James M. Skorich

(57) ABSTRACT

An optical atomic clock includes a fiber-coupled electro-optic modulator to phase modulate and suppress residual amplitude modulation of a frequency-doubled laser; a rubidium-enriched vapor cell configured to perform a two-photon transition of rubidium atoms to generate a fluorescence signal from the laser; and a differential lock mechanism to stabilize a frequency of the fluorescence signal to a resonance frequency of the two-photon transition of the rubidium atoms.

19 Claims, 12 Drawing Sheets

(51) Int. Cl.
*H03L 7/26* (2006.01)
*H01S 3/00* (2006.01)
*H01S 3/13* (2006.01)
*G02F 1/365* (2006.01)

(58) Field of Classification Search
CPC .......... G01J 3/0085; G04F 5/14; G04F 5/145; H03L 7/26
USPC ........... 331/3, 94.1; 385/2, 30; 359/245, 239
See application file for complete search history.

(56) References Cited

U.S. PATENT DOCUMENTS

| | | | |
|---|---|---|---|
| 7,852,163 B2 | 12/2010 | Braun et al. | |
| 7,872,473 B2 | 1/2011 | Kitching et al. | |
| 7,944,317 B2 | 5/2011 | Strabley et al. | |
| 7,965,147 B2 | 6/2011 | Strabley et al. | |
| 8,237,514 B2 | 8/2012 | Aoyama et al. | |
| 8,242,851 B2 | 8/2012 | Youngner et al. | |
| 8,334,690 B2 | 12/2012 | Kitching et al. | |
| 8,373,112 B2 | 2/2013 | Bouyer et al. | |
| 8,417,076 B2 * | 4/2013 | Maleki | G02F 2/02 359/239 |
| 8,624,682 B2 | 1/2014 | Ridley et al. | |
| 8,643,441 B2 | 2/2014 | Aoyama et al. | |
| 8,810,325 B2 | 8/2014 | Aoyama et al. | |
| 8,816,779 B2 | 8/2014 | Lecomte et al. | |
| 8,816,783 B2 | 8/2014 | Lecomte et al. | |
| 8,836,327 B2 | 9/2014 | French et al. | |
| 8,854,146 B2 | 10/2014 | Schober et al. | |
| 8,907,276 B2 | 12/2014 | Nelson et al. | |
| 9,048,852 B2 | 6/2015 | Marmet | |
| 9,077,354 B2 | 7/2015 | Strabley et al. | |
| 9,134,450 B2 | 9/2015 | Desruelle et al. | |
| 9,136,851 B2 | 9/2015 | Yano et al. | |
| 9,164,491 B2 | 10/2015 | Ridley et al. | |
| 9,285,249 B2 | 3/2016 | Schober et al. | |
| 9,410,885 B2 | 8/2016 | Schober et al. | |
| 9,507,179 B2 | 11/2016 | Aoyama et al. | |
| 9,726,626 B2 | 8/2017 | Smith et al. | |
| 9,726,733 B2 | 8/2017 | Smith et al. | |
| 9,778,328 B2 | 10/2017 | Bulatowicz et al. | |
| 9,869,731 B1 | 1/2018 | Hovde et al. | |
| 9,917,592 B2 | 3/2018 | Yano et al. | |

OTHER PUBLICATIONS

Phelps, G., et al., "A Compact Optical Rubidium Atomic Frequency Standard," Proceedings of the 47th Annual Precise Time and Time Interval Systems and Applications Meeting, Monterey, California, Jan. 2016, pp. 157-160.

Phelps, G., et al., "Two-Photon Spectroscopy in Rb for an Optical Frequency Standard," Frontiers in Optics 2015, OSA Technical Digest, Optical Society of America, Oct. 2015, paper LTh41.5, 1 page.

Phelps, G., et al., "Two-Photon Spectroscopy in Rb for an Optical Frequency Standard," Frontiers in Optics 2015, OSA Technical Digest, Optical Society of America, Oct. 2015, Presentation, 25 pages.

Phelps, G., et al., "An Optical Frequency Standard Using Two-Photon Spectroscopy in Rubidium," Optical Frequency Standards & Applications I—Poster Session, IEEE International Frequency Control Symposium, New Orleans, Louisiana, May 2016, 3 pages.

Yoon, T., et al., "High-resolution Rb two-photon spectroscopy with ultrafast lasers," JILA, National Institute of Standards and Technology and University of Colorado, 2001, 9 pages.

Lemke, N., et al., "An Introduction to Atomic Timing and Navigation," Space Dynamics Laboratory—Utah State University (SDL-USU) Technical Lecture Series, Logan, Utah, Dec. 2, 2015, 18 pages.

* cited by examiner

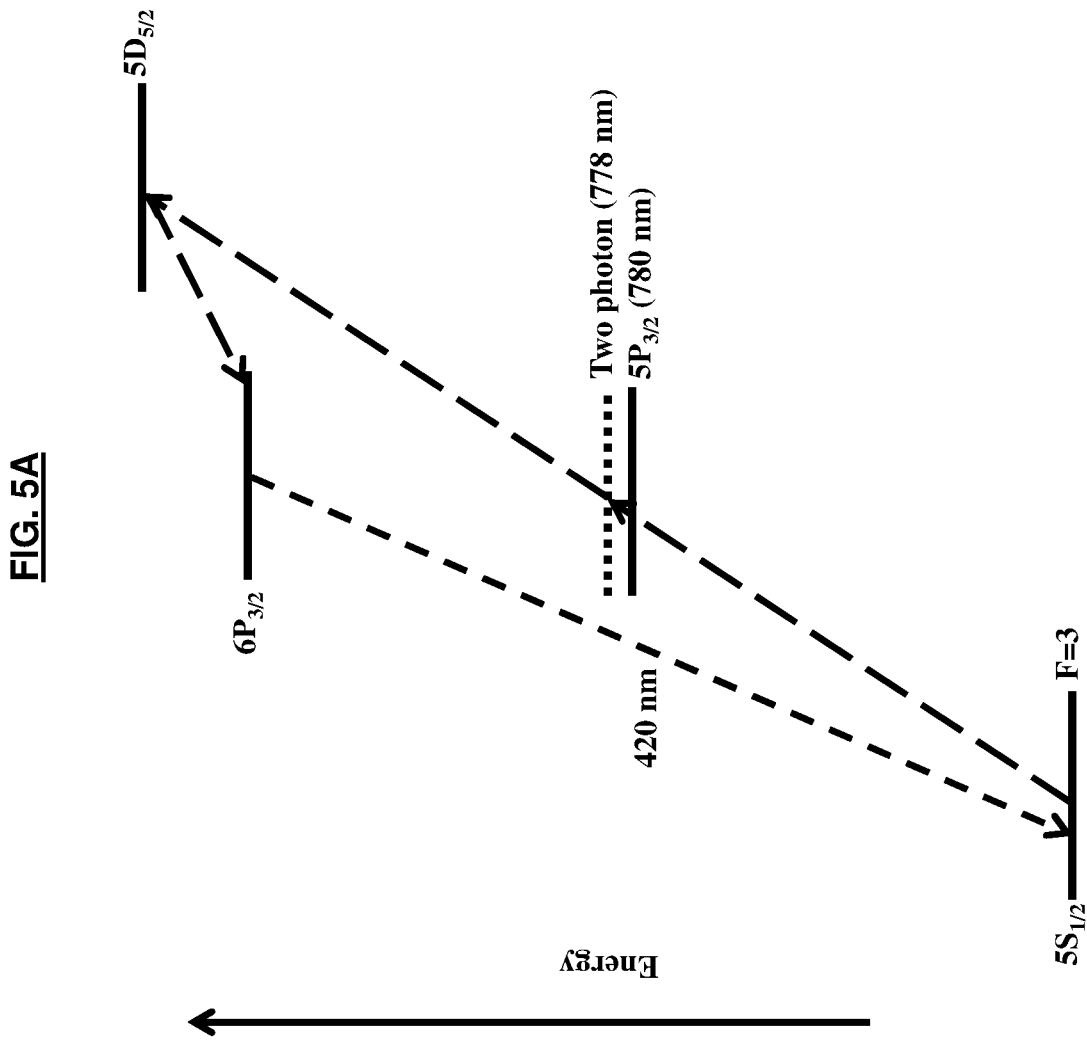

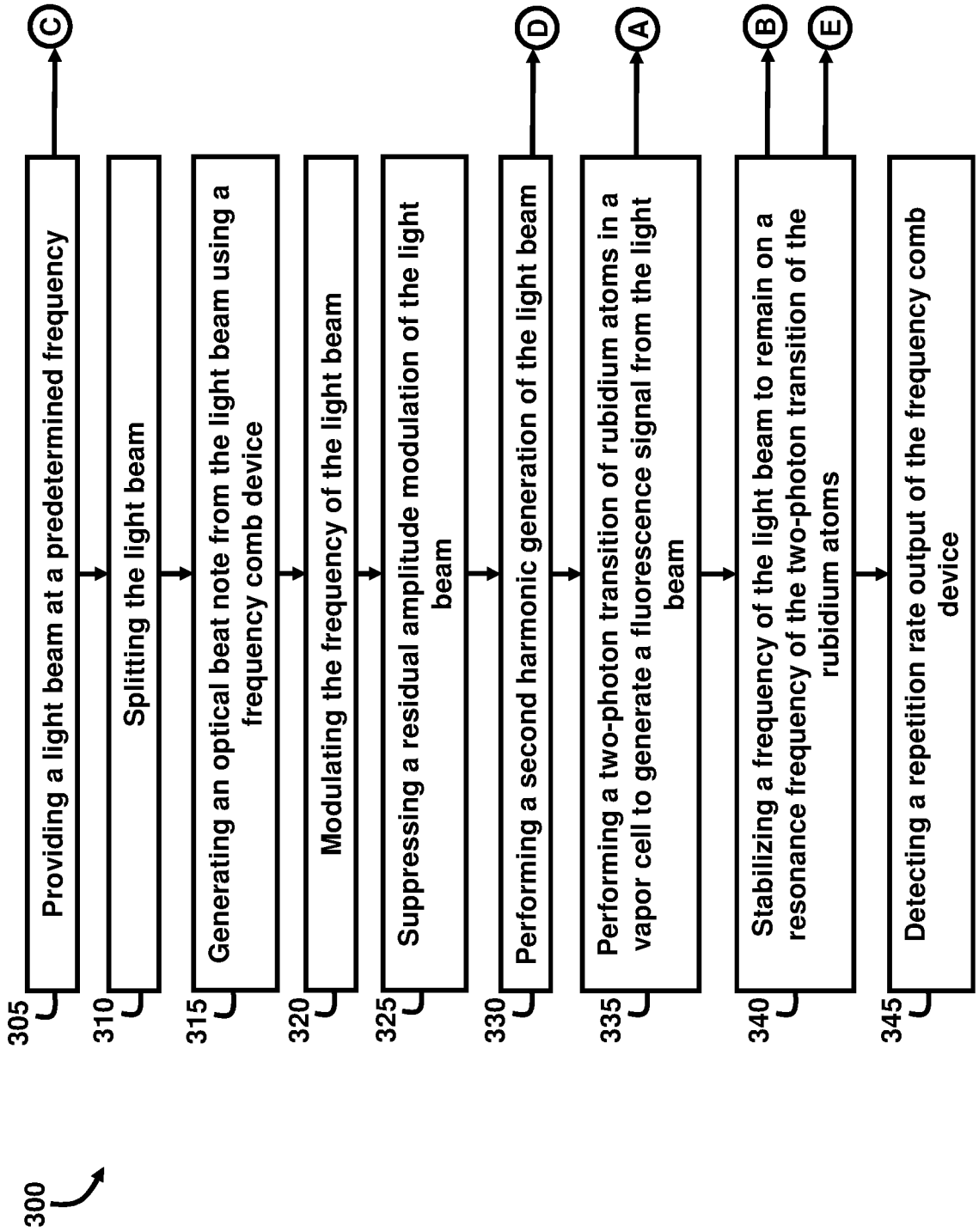

FIG. 6B

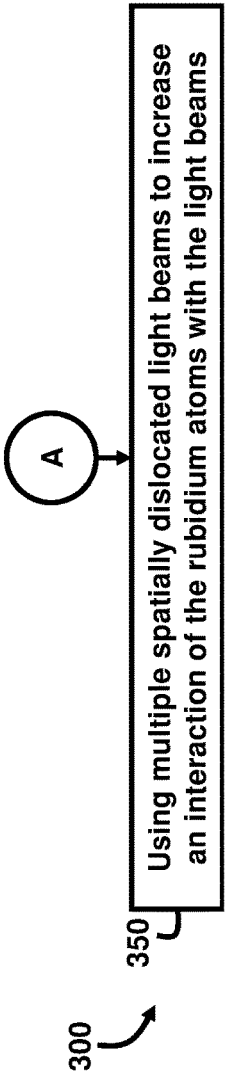

350 — Using multiple spatially dislocated light beams to increase an interaction of the rubidium atoms with the light beams

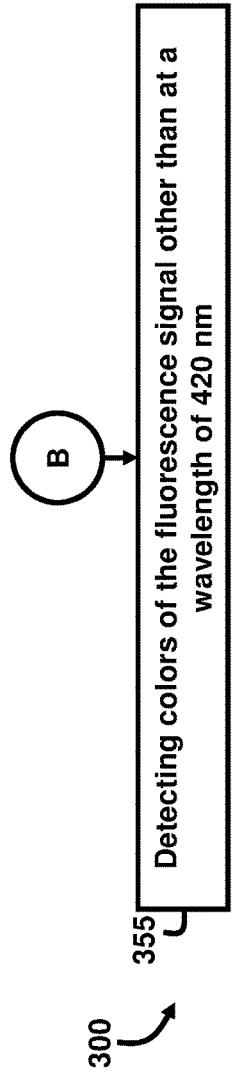

355 — Detecting colors of the fluorescence signal other than at a wavelength of 420 nm

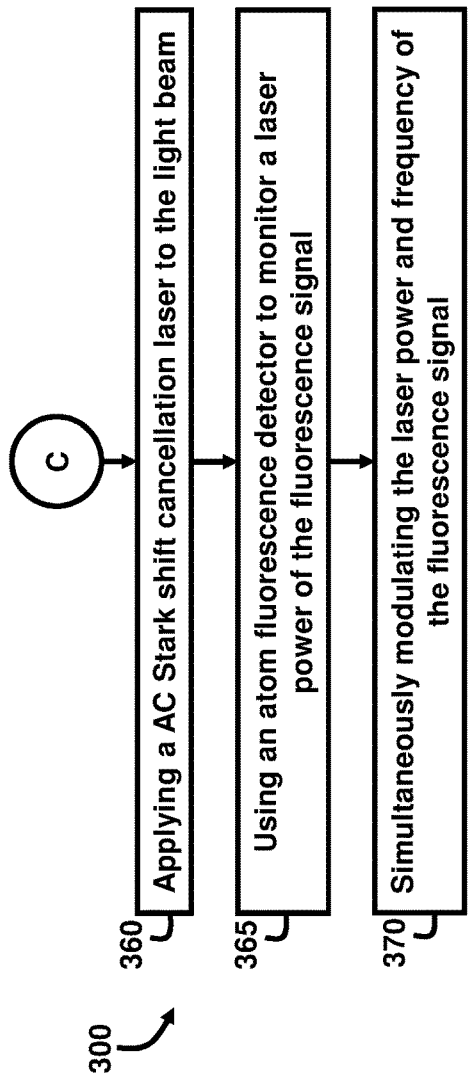

360 — Applying a AC Stark shift cancellation laser to the light beam

365 — Using an atom fluorescence detector to monitor a laser power of the fluorescence signal 370 — Simultaneously modulating the laser power and frequency of the fluorescence signal

300

375 — Stabilizing a power of the light beam prior to delivery into the vapor cell at approximately 30 mW 380 — Stabilizing a fractional frequency of the light beam to $1 \times 10^{-15}$ at one day

OPTICAL RUBIDIUM ATOMIC FREQUENCY STANDARD

CROSS-REFERENCE TO RELATED APPLICATION

This application claims the benefit of provisional U.S. Application No. 62/690,651 filed Jun. 27, 2018, and incorporated herein by reference in its entirety.

GOVERNMENT INTEREST

The invention described herein may be manufactured and used by or for the Government of the United States for all government purposes without the payment of any royalty.

FIELD OF THE INVENTION

The embodiments herein generally relate to atomic clocks, and more particularly to the optical rubidium atomic frequency standard for atomic clocks.

BACKGROUND OF THE INVENTION

High stability clocks and oscillators play an integral role in many modern technologies such as navigation and communications. Laboratory-based primary frequency standards, which utilize microwave transitions between atomic hyperfine levels, provide the highest degree of timing accuracy and are used to form international timescales; in many cases, however, applications beyond timekeeping require clocks that are deployed outside the laboratory setting. One well-known case is that of global navigation satellite systems (GNSS), which employ space-qualified frequency standards aboard satellites in medium earth orbit and/or geosynchronous orbit. While portable clocks are typically outpaced by their laboratory counterparts in terms of stability and accuracy, they nonetheless offer very low levels of frequency instabilities; in the case of rubidium atomic frequency standards, clocks are commercially available with a drift rate below $1 \times 10^{-13}$/day and a frequency noise floor less than $1 \times 10^{-14}$.

Microwave fountain clocks that incorporate lasers for cooling transitions and utilize a cryogenic sapphire oscillator (CSO) are an ongoing research effort yielding instabilities as low as $1.4 \times 10^{-14}/\sqrt{\tau}$. Recently, deployable microwave clocks leveraging a laser cooled Rb have been integrated in satellite systems and others utilizing a pulsed optical pumping routine have shown fractional frequency instability as low as $1.4 \times 10^{-13}/\sqrt{\tau}$, with potential to meet constrained size and power requirements for on orbit operation.

With the advent of fully stabilized optical frequency combs, optical frequency standards have rapidly surpassed the capabilities of microwave clocks in both stability and systematic uncertainty. Efforts to reduce the size and increase portability of these systems are an ongoing area of interest. However, these improvements have yet to make an impact on more stringent definitions of portable and deployable clocks, some requirements constraining total clock volume to less than 30 liters. Much of the difficulty in developing compact and environmentally robust optical frequency standards lies with the complicated laser sources and optical systems required for laser cooling and interrogating an atomic sample. Moreover, given the high-quality factor (i.e. narrow spectral linewidth) of typical optical clock transitions, laser pre-stabilization to a high-finesse Fabry-Perot cavity is generally required, which adds significant complexity to the system. Finally, optical frequency combs have historically not been sufficiently compact or robust to warrant an effort toward deployment.

The two-photon transition in rubidium has been described in U.S. Pat. No. 8,780,948 for a precision photonic oscillator, which is a device meant to generate low phase noise microwaves. The oscillator utilizes a "cavity stabilized reference laser" to achieve fractional frequency stability below $5 \times 10^{-14}$. However, the cavity stabilization substantially increases the size, weight, complexity, and cost of the system. The nature of an optical cavity is to introduce a length reference to the system that comprises the distance between the mirror or roundtrip distance of the light if there are more than two mirrors. This length scale adds significant sensitivity to mechanical disturbances from acceleration, vibration, and/or thermal expansion.

Space-based atomic frequency standards are critical to the operation of global navigation satellite systems. Conventional space-qualified atomic clocks have several undesirable features including a reliance on specialized parts and manufacturing processes, significant frequency drift, and occasional on-orbit frequency anomalies that lead to increased user range error.

BRIEF SUMMARY OF THE INVENTION

In view of the foregoing, an embodiment herein provides an apparatus comprising a laser source to generate a light beam at a predetermined frequency; a frequency comb device to generate an optical beat note from a first portion of the light beam; an optical waveguide to modulate a phase of a second portion of the light beam, wherein the optical waveguide comprises a fiber-coupled electro-optic modulator, and wherein residual amplitude modulation is suppressed in the optical waveguide; an erbium doped fiber amplifier to amplify the frequency of the second portion of the light beam; a vapor cell assembly comprising rubidium atoms, the vapor cell assembly configured to perform a two-photon transition of the rubidium atoms to generate a fluorescence signal from the second portion of the light beam; a controller to lock a frequency of the fluorescence signal to a resonance frequency of the two-photon transition of the rubidium atoms; a frequency counter to count the optical beat note; and a processor to compare the locked frequency of the fluorescence signal to the optical beat note.

The apparatus may comprise a voltage source to apply a DC offset voltage to the electro-optic modulator. The apparatus may comprise an optical filter to filter a portion of the fluorescence signal; and a photomultiplier tube in conjunction with a current pre-amplifier to detect a magnitude of the portion of the fluorescence signal filtered by the optical filter. The apparatus may comprise a magnetic shield comprising dual-zone temperature regions surrounding the vapor cell assembly. The apparatus may comprise a thermo-generating device to heat the vapor cell assembly to approximately 100° C. The photomultiplier tube and the current pre-amplifier may be configured to monitor laser power of the portion of the fluorescence signal filtered by the optical filter. The apparatus may comprise a splitter to split the light beam into the first portion and the second portion.

Another embodiment provides an optical atomic clock comprising a fiber-coupled electro-optic modulator to phase modulate and suppress residual amplitude modulation of a frequency-doubled laser; a rubidium-enriched vapor cell configured to perform a two-photon transition of rubidium atoms to generate a fluorescence signal from the laser; and a differential lock mechanism to stabilize a frequency of the fluorescence signal to a resonance frequency of the two-photon transition of the rubidium atoms. The optical atomic clock may comprise a detector to detect a magnitude of the fluorescence signal, and a retro-reflector that is positioned facing the detector. The detector may detect light comprising an optical wavelength of approximately 776 nm emitted from the rubidium atoms. The optical atomic clock may comprise a photodiode to detect the residual amplitude modulation of the laser, wherein the electro-optic modulator is to undergo voltage biasing to remove the residual amplitude modulation of the laser. The differential lock mechanism is to stabilize a fractional frequency instability of the laser to $1 \times 10^{-13}$ at one second.

Another embodiment provides a method comprising providing a light beam at a predetermined frequency; splitting the light beam; generating an optical beat note from the light beam using a frequency comb device; modulating the frequency of the light beam; suppressing a residual amplitude modulation of the light beam; performing a second harmonic generation of the light beam; performing a two-photon transition of rubidium atoms in a vapor cell to generate a fluorescence signal from the light beam; stabilizing a frequency of the light beam to remain on a resonance frequency of the two-photon transition of the rubidium atoms; and detecting a repetition rate output of the frequency comb device. The method may comprise using multiple spatially dislocated light beams to increase an interaction of the rubidium atoms with the light beams. The method may comprise detecting colors of the fluorescence signal other than at a wavelength of 420 nm. The method may comprise applying a AC Stark shift cancellation laser to the light beam. The method may comprise using an atom fluorescence detector to monitor a laser power of the fluorescence signal. The method may comprise simultaneously modulating the laser power and frequency of the fluorescence signal, wherein a frequency shift of the fluorescence signal and the AC Stark shift are equal. The method may comprise stabilizing a power of the light beam prior to delivery into the vapor cell at approximately 30 mW, wherein the light beam is delivered into the vapor cell at a wavelength of approximately 778 nm. The method may comprise stabilizing a fractional frequency of the light beam to $1 \times 10^{-15}$ at one day.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 5A is a partial energy level diagram of rubidium (Rb), according to an embodiment herein;

FIG. 6A is a flow diagram illustrating a method for providing a frequency standard, according to an embodiment herein;

FIG. 6B is a flow diagram illustrating a method of increase an interaction of Rb atoms with the light beams, according to an embodiment herein;

FIG. 6C is a flow diagram illustrating a method of detecting colors of a fluorescence signal, according to an embodiment herein;

FIG. 6D is a flow diagram illustrating a method of applying a AC Stark shift cancellation laser to a light beam, according to an embodiment herein;

DETAILED DESCRIPTION OF THE INVENTION

Figure 1:
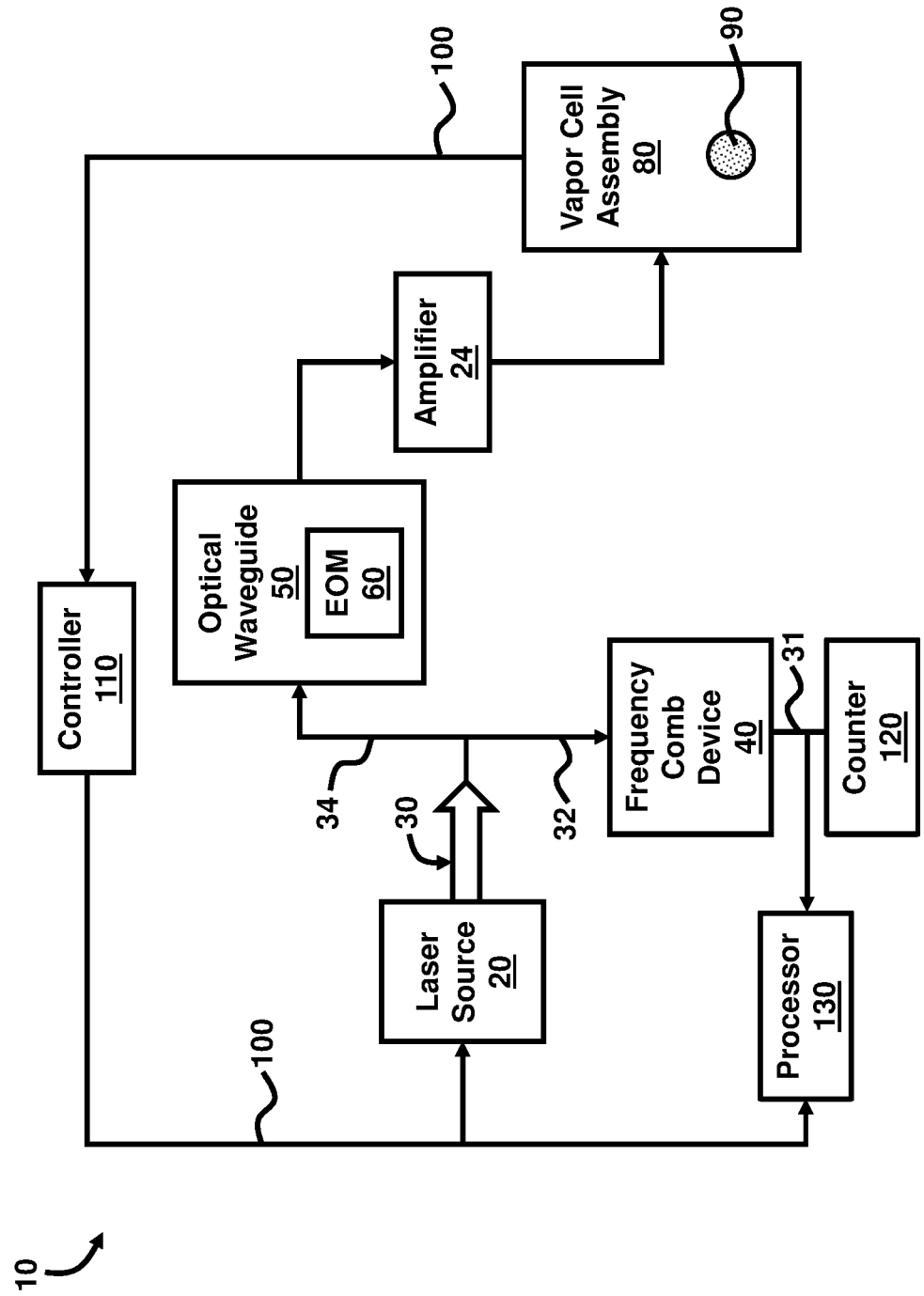
FIG. 1 is a block diagram illustrating an apparatus for generating a frequency standard, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

In the drawings, the size and relative sizes of layers and regions may be exaggerated for clarity. The embodiments herein provide a testing technique to determine the stability of the frequency of a signal for an atomic optical clock. The embodiments herein utilize a two-photon transition of rubidium atoms in a vapor cell, and are able to achieve fractional frequency stabilities to within $1 \times 10^{-13}$ of the resonance frequency of the two-photon transition of rubidium atoms at 1 second or within $1\times10^{-15}$ of the resonance frequency at 24 hours. The embodiments herein utilize a technique to remove the residual amplitude modulation of a light beam using DC biasing and temperature control. An optical filter is used to allow detection of other colors of fluoresced light in the two-photon rubidium transition other than at 420 nm including 776 nm (e.g., red light). In an example, the embodiments herein use multiple spatially dislocated laser beams to increase the number of atoms that interact with the beam, which improves the detection of the fluorescent signal generated by the vapor cell. The embodiments herein may use an AC Stark shift cancellation laser or a combination of comb teeth and laser power ratio stabilization of the cancellation laser to the primary frequency standard laser. The embodiments herein provide for power stabilization of the laser beam and modulates the laser power and frequency such that the real frequency shift of the fluorescent signal and the AC Stark shift due to the power modulation are the same. An atom fluorescence detector may be used to simultaneously and accurately monitor the laser power of the fluorescent signal. Referring now to the drawings, and more particularly to FIGS. 1 through 9 where similar reference characters denote corresponding features consistently throughout, there are shown exemplary embodiments.

FIG. 1 illustrates an apparatus 10 for providing an atomic frequency standard. Alkali metals are an alluring choice for frequency standard technologies because of their simple hydrogen-like electronic structure. Doppler free two-photon absorption spectroscopy on these elements is of particular importance, with numerous metrological applications that include the measurement of fundamental constants, advanced network systems, and precision navigation. An optical frequency standard allows for improved stability and better performance. More specifically, with the availability of Rb vapor cells, commercially available diode and telecom lasers, the $5S_{1/2} \rightarrow 5D_{5/2}$ two-photon energy level transition in Rb is of interest for an atomic frequency standard. The apparatus 10 comprises a laser source 20 to generate a light beam 30 at a predetermined frequency. In an example, the laser source 20 may be configured as an AlGaAs diode laser system that produces 20 mW of narrow-band light (e.g., light beam 30). The laser source 20 acts as the local oscillator for the frequency standard. The apparatus 10 includes a frequency comb device 40 to generate an optical beat note 31 from a first portion 32 of the light beam 30. The optical beat note 31 comprises an oscillation signal of a difference of multiple optical signal frequencies. The frequency comb device 40 may be an Er-doped, fiber-based frequency comb device 40 that down-converts the light beam 30 to the radio frequency (RF) domain. According to an example, this fully self-referenced frequency comb device 40 coherently divides an 385 THz optical waveform associated with the light beam 30 to approximately 200 MHz, which is the pulse repetition rate of the frequency comb device 40.

Figure 2:
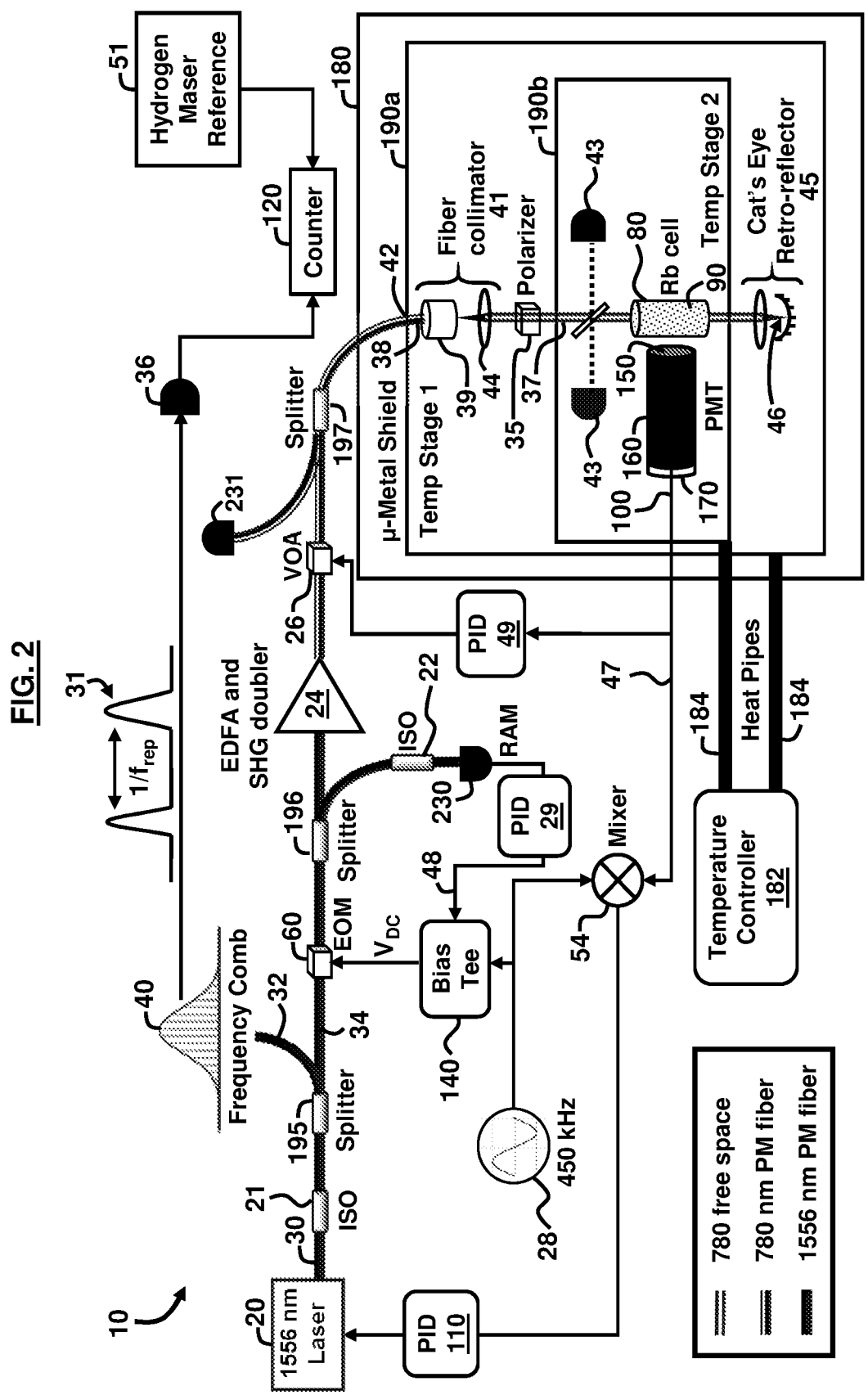
FIG. 2 is a block diagram illustrating a more detailed example of the apparatus of FIG. 1, according to an embodiment herein.

After stabilization of the optical beat note 31 and carrier envelope offset frequency, the repetition rate of the frequency comb device 40 may be photodetected by a detector 36 (shown in FIG. 2) and the phase noise is compared to a hydrogen maser 51 (shown in FIG. 2). The apparatus 10 includes an optical waveguide 50 to modulate a phase (i.e., phase modulation) of a second portion 34 of the light beam 30, wherein the optical waveguide 50 comprises a fiber-coupled electro-optic modulator 60, and wherein residual amplitude modulation is suppressed in the optical waveguide 50. Accordingly, the remaining portion of the 1556 nm laser output (e.g., light beam 30) from the laser source 20 enters the fiber-coupled electro-optic modulator 60, which is formed in the proton-exchange optical waveguide 50, which is embedded in lithium niobate.

Accordingly, the apparatus 10 includes an erbium doped fiber amplifier 24 to amplify the frequency of the second portion 34 of the light beam 30. A vapor cell assembly (also referred to herein as "vapor cell") 80 comprising rubidium atoms 90 is provided, and the vapor cell assembly 80 is configured to perform a two-photon transition of the rubidium atoms 90 to generate a fluorescence signal 100 from the second portion 34 of the light beam 30. Use of atoms to generate the fluorescence signal 100, and in particular use of the rubidium atoms 90, allows for atomic transitions for developing the frequency standard. The rubidium atoms 90 are ageless, identical, have a high quality (Q) value (high energy value), and can be safely isolated from the environment using the vapor cell assembly 80.

The use of the two-photon transition of the rubidium atoms 90 is selected to provide the frequency standard for several reasons. First, the relatively large atomic linewidth ($\Delta v \approx 330$ kHz, $Q \approx 1 \times 10^9$) eliminates the need for pre-stabilization of the clock laser and enables high-bandwidth feedback from the atomic signal to the clock laser. Second, the two-photon architecture provides a simple method for overcoming Doppler broadening without the need to implement laser cooling, as in most optical clocks, or the buffer gases used in many RF clocks. Third, use of the frequency comb device 40 enables both the required optical clockwork as well as the possibility for space-based spectroscopy and time-transfer protocols.

The Rb two-photon transition may be accessed through either 778 nm diode lasers or second harmonic generation (SHG) of telecom fiber lasers at 1556 nm. The natural linewidth of the 385 THz transition from $5S_{1/2} \rightarrow 5D_{5/2}$ is 333 kHz, which yields a quality factor, or Q, of $1.1 \times 10^9$. Furthermore, due to the 2 nm detuning from the resonant intermediate state of $5P_{3/2}$, the $5S_{1/2} \rightarrow 5D_{5/2}$ transition has a relatively large excitation rate, enabling clock operation with modest optical power on the order of 100 mW. More specifically, the relatively small 2 nm detuning between the two-photon virtual intermediate state and the $5P_{3/2}$ state enables significant laser excitation of the vapor at modest optical intensity (for example, 500/s per atom for 30 mW of laser power and a 0.6 mm intensity radius). After excitation to the $5D_{5/2}$ state, decay to the $6P_{3/2}$ level occurs, upon which the emission of a 420 nm photon results in the transition back to the $5S_{1/2}$ ground state. Photodetection of the 420 nm fluorescence yields a high SNR because a spectral filter blocks the 778 nm light.

The apparatus 10 further includes a controller 110 to lock a frequency of the fluorescence signal 100 to a resonance frequency of the two-photon transition of the rubidium atoms 90. In an example, the controller 110 comprises a proportional integral differential (PID) lock mechanism. Moreover, the detected fluorescence signal 100 is used to feedback to the current and piezo voltage of the laser source 20. The apparatus 10 also includes a frequency counter 120 to count the optical beat note 31, and a processor 130 to compare the locked frequency of the fluorescence signal 100 to the optical beat note 31. In an example, the processor 130 may be a computer central processing unit (CPU), multiple CPUs, microprocessors, hardware engines, and/or other hardware processing devices, which may be programmed to perform processing, calculations, comparisons, and analysis of the fluorescence signal 100. The frequency counter 120 may be a 12-digit frequency counter 120, according to an example.

As shown in FIG. 2, with reference to FIG. 1, the light beam 30 first enters an optical isolator (ISO) 21, and then enters a splitter 195 to create the first portion 32 of the light beam 30. The first portion 32 is a small part of the light beam 30 sampled by the splitter 195 to form the optical beat note 31 with the fiber frequency comb device 40. Accordingly, the splitter 195 may split the light beam 30 into the first portion 32 and the second portion 34. After the electro-optic modulator 60, after being sampled by the splitter 196, the light beam 30 may be amplified by an erbium-doped fiber amplifier 24 and, though a single-pass, undergoes second harmonic generation in a periodically-poled lithium niobate crystal (not shown). A portion of the light beam 30 that is split in the splitter 196 proceeds to an ISO 22 and then moves to a detector 230 for RAM signal detection, as further described below. The output of the crystal, typically around 100 mW, is subsequently sent through a variable optical attenuator (VOA) 26, which is used for laser power stabilization as further described below. In an example, after being sampled through a splitter 197, approximately 30 mW of 778 nm light, which may be detected by a retro-reflective detector 231, is delivered to the vapor cell assembly 80. In some examples, the splitters 195, 196, 197 may be optical beam splitters, which may be configured as glass prisms having appropriately positioned ports and reflective dielectric coatings to split the light beam 30 with desired phase shifts. According to some examples the ISOs 21, 22 may be configured as polarization dependent or independent optical isolators.

The apparatus 10 may comprise a voltage source (e.g., configured as a bias tee, for example) 140 to apply a DC offset voltage ($V_{DC}$) to the electro-optic modulator 60. The DC offset voltage ($V_{DC}$) may be applied to the electro-optic modulator 60 for residual amplitude modulation (RAM) suppression of the light beam 30. For example, the DC offset voltage ($V_{DC}$) may result in >30 dB suppression of the RAM signal. In an example, the voltage source may be driven by a controller (e.g., PID) 29. The apparatus 10 may comprise an optical filter 150 to filter a portion of the fluorescence signal 100, and a photomultiplier tube 160 in conjunction with a current pre-amplifier 170 to detect a magnitude of the portion of the fluorescence signal 100 (e.g., 420 nm) filtered by the optical filter 150. The photomultiplier tube 160 and the current pre-amplifier 170 may be configured to monitor laser power of the portion of the fluorescence signal 100 filtered by the optical filter 150.

Detection of the excitation rate of the fluorescence signal 100 is accomplished by monitoring the atomic fluorescence at 420 nm, corresponding to the $6P_{3/2} \rightarrow 5S_{1/2}$ decay channel. Stray 778 nm light is rejected by the optical filter 150, enabling a high signal-to-noise ratio measurement. Coupled with a high vapor density (e.g., $10^{18}$-$10^{19}$/m$^3$), the apparatus 10 for detection rates of $10^{10}$/s.

The apparatus 10 may comprise a magnetic shield 180 comprising dual-zone temperature regions 190a, 190b surrounding the vapor cell assembly 80. In an example, the magnetic shield 180 may be approximately 5 mm thick, and may be a single layer µ-metal magnetic shield 180 to reduce spectral broadening associated with the Zeeman shift, as further described below. The apparatus 10 may comprise a resistive thermo-generating device 182, which acts as a heater or temperature controller to heat the vapor cell assembly 80 to approximately 100-110° C. This temperature generates sufficient vapor density for the frequency standard. To avoid local magnetic fields when heating the vapor cell assembly 80, all heat is generated by the resistive thermo-generating device 182 located outside of the magnetic shield 180. Water-filled heat pipes 184 are provided, which protrude through the magnetic shield 180 and provide heat to the dual-zone temperature control stage (e.g., Temp Stage 1 and Temp Stage 2) surrounding the vapor cell assembly 80.

In an example, the vapor cell assembly 80 may be configured to be a rectangular parallelepiped assembly with dimensions of 5×5×25 mm, although other dimensions are possible. The vapor cell assembly 80 contains >99% isotopically enriched $^{87}$Rb. The vapor cell assembly 80 is positioned such that it has a 1 K thermal gradient along its length, which forces a cold spot of the vapor cell 80 on the pinched-off fill tube of the borosilicate glass cell. Moreover, the vapor cell assembly 80 is oriented at Brewster's angle with respect to the incident laser beam 37 to reduce stray reflections.

The 778 nm laser output is delivered by a polarization-maintaining optical fiber 38 through an opening 42 in the magnetic shield 180, where it is collimated (1/e$^2$ intensity radius $w_0$=0.66 mm) using a non-magnetic optical assembly 39. A calcite Glan-Taylor polarizer 35 may be placed at the output of the fiber collimator 41 to reduce polarization wander. The laser beam 30 may be sampled by a glass plate 44 before entering the vapor cell assembly 80, in an example. This sampling of the laser beam 30 may provide feedback for the current pre-amplifier 170. Photodetectors 43, having a dark current (absence of light) of 20 nA, are positioned on each side of the glass plate 44 to monitor the optical power in the sampled beams 30. A cat's eye retro-reflector 45 is positioned to provide a precisely anti-parallel reflected beam 46, and which eliminates Doppler broadening. A portion of the fluorescence signal 100 at 420 nm passes through the short-pass optical filter 150 and is detected by the photomultiplier tube 160, configured with a dark current of 5 nA. The photomultiplier tube 160 provides a fast temporal response and high electron-multiplying gain. After the transimpedance amplifier (e.g., pre-amplifier 170), the output signal 47 from the photomultiplier tube 160 is demodulated by the sinusoidal modulation applied to the electro-optic modulator 60 in a phase detector 230, resulting in a laser detuning-dependent error signal 48 for locking the output signal 47 to the atomic resonance. The digital servo controller 110 may be configured with dual integrators and approximately 50 kHz bandwidth, and feeds the 1556 nm laser's current to hold the laser 30 on the two-photon resonance.

The embodiments herein allow for the study of various parameters that contribute to the system's performance at different time scales. The short-term stability is determined by the atomic linewidth, optical intensity, detector collection efficiency, and laser frequency noise characteristics. The long-term stability, with a goal of ~1×10$^{-15}$ at one day, requires the stabilization of various experimental and environmental parameters including the vapor cell temperature (Rb vapor density), magnetic field, and optical power, which are further described below with respect to the experimental descriptions, according to the embodiments herein.

Figure 3:
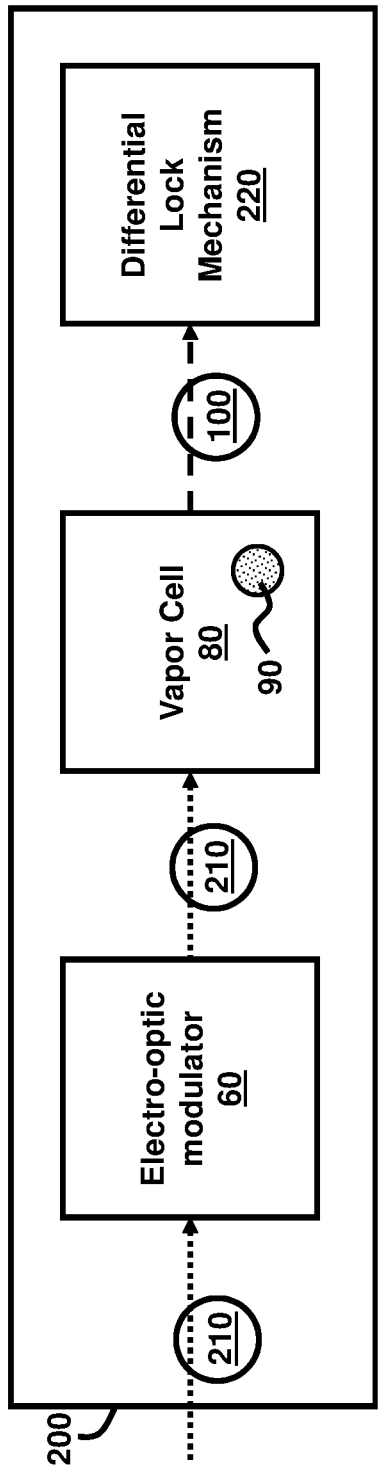
FIG. 3 is a block diagram illustrating an optical atomic clock, according to an embodiment herein.

FIG. 3, with reference to FIGS. 1 and 2, illustrates a block diagram of an optical atomic clock 200 according to an embodiment herein. The optical atomic clock 200 comprises a fiber-coupled electro-optic modulator 60 to phase modulate and suppress residual amplitude modulation of a frequency-doubled laser 210, and a rubidium-enriched vapor cell 80 configured to perform a two-photon transition of rubidium atoms 90 to generate a fluorescence signal 100 from the laser 210. The accuracy of the atomic clock 200 refers to whether the mean frequency of the clock 200 matches that of an unperturbed atom 90. In an example, the vapor cell 80 may comprise quartz or a low-thermal-expansion borosilicate glass. A differential lock mechanism 220 is provided to stabilize a fractional frequency instability of the laser 210 to $1\times10^{-13}$ at one second. The optical atomic clock 200 is optical Rb atomic frequency standard portable clock, according to an example.

Figure 4:
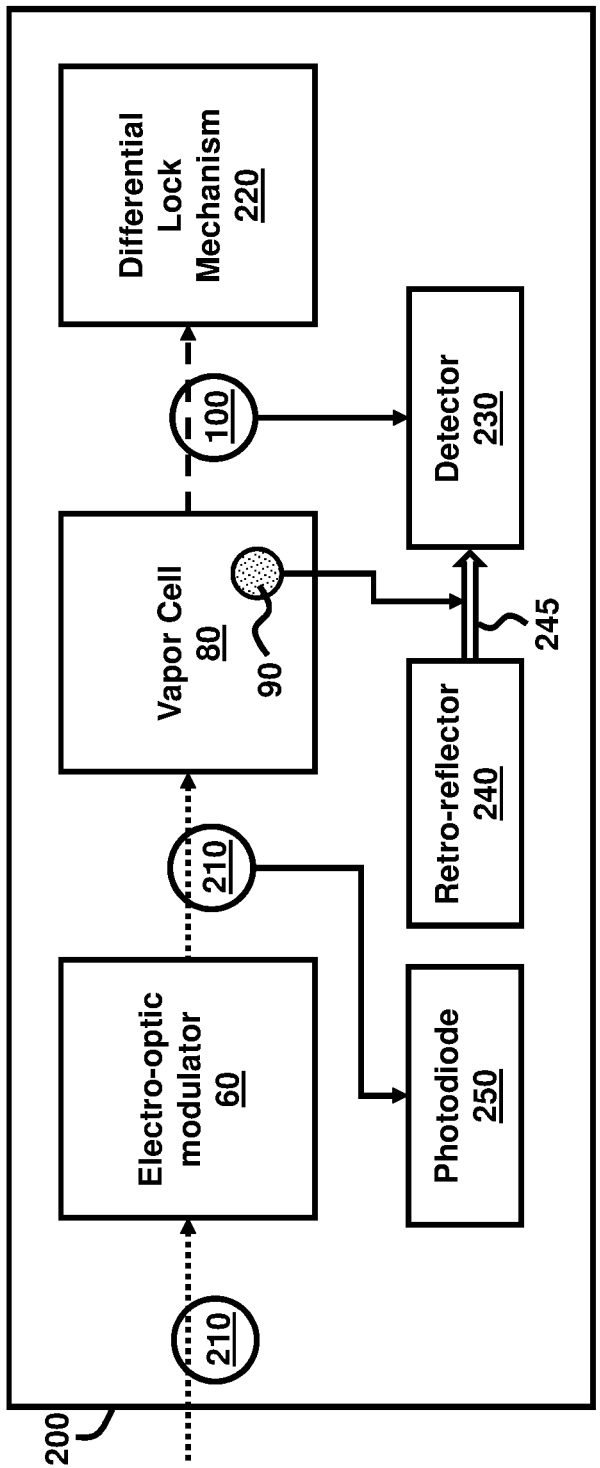
FIG. 4 is a block diagram illustrating a more detailed example of the optical atomic clock of FIG. 3, according to an embodiment herein.

As shown in FIG. 4, with reference to FIGS. 1 through 3, the optical atomic clock 200 may comprise a detector 230 to detect a magnitude of the fluorescence signal 100, and a retro-reflector 240 that is positioned facing the detector 230. The detector 230 may detect light 245 comprising an optical wavelength of approximately 776 nm emitted from the rubidium atoms 90. The retro-reflector 240 may allow for enhanced detection of the fluorescence signal 100. The optical atomic clock 200 may comprise a photodiode 250 to detect the residual amplitude modulation of the laser 210, wherein the electro-optic modulator 60 is to undergo voltage biasing to remove the residual amplitude modulation of the laser 210. The differential lock mechanism 220 may stabilize the fractional frequency instability of the laser 210 to $1\times10^{-13}$ at one second. The clock performance is limited on short-time scales by photon shot noise, which can be readily overcome by increasing either the vapor density (via the temperature of the vapor cell 80) or the intensity of the laser 210.

Figure 5B:
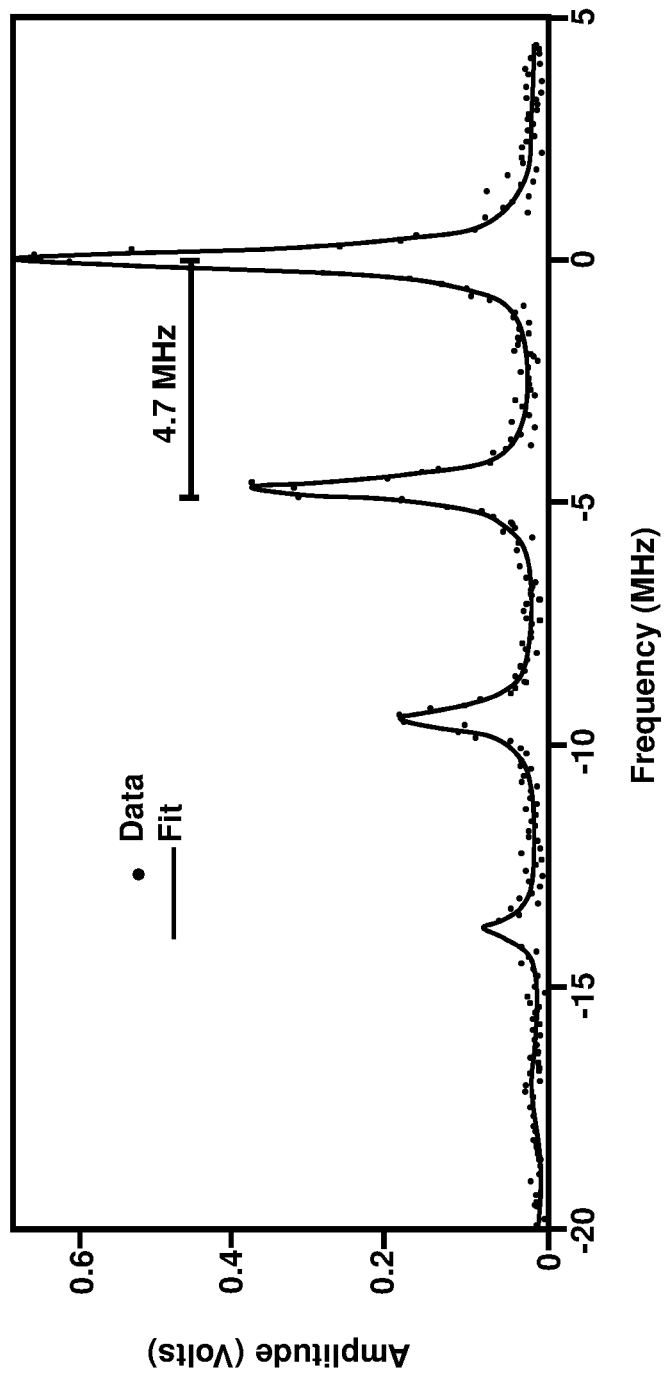
FIG. 5B is a graphical representation of the two-photon excitation spectrum of $^{85}$Rb, according to an embodiment herein.

The optical atomic clock 200 is based on a two-photon transition in a hot Rb vapor. Two-photon transitions are used because they enable Doppler-free spectra without the need for laser-cooling, provided two anti-parallel laser beams from the laser 210 are used to interrogate the atomic vapor. Moreover, the two-photon transition can often be observed via the fluorescence signal 100 that is spectrally resolvable from the probe laser 210; together with the large number of atoms interrogated in the vapor phase, this enables a very high signal-to-noise measurement of the clock transition. For the case of the Rb two-photon transition at 778 nm, fluorescence may be readily observable at 420 nm, and stray light in the near infrared is rejected with optical filtering techniques. In the case of the Rb $5S_{1/2}\rightarrow5D_{5/2}$ transition from the nearby intermediate state $5P_{3/2}$ that is only separated by 2 nm from the virtual two-photon state, as shown in FIGS. 5A and 5B, with reference to FIGS. 1 through 4, significant atomic excitation rates may be achieved at modest optical intensities. Conveniently, 778.1 nm light can be produced by second harmonic generation (SHG) of 1556.2 nm, which falls in the telecommunications C-band, allowing the use of mature laser sources 20 and erbium fiber frequency combs 40. Moreover, the availability of commercial laser systems for which the fast linewidth is significantly below the natural linewidth of the excited clock state ($\Delta v \approx 330$ kHz as observed at 778 nm), alleviates the requirement for laser pre-stabilization to a high finesse optical cavity. Utilizing the hot atomic vapor, two-photon optical atomic clock 200 requires mitigation or compensation for the AC Stark shifts, wherein two-photon transitions typically have large AC Stark shifts. These AC Stark shifts are mitigated or compensated, and precision temperature control is utilized while probing the hot atomic vapor.

The vapor cell-based two-photon optical atomic clock 200 is configured as a frequency standard that can surpass existing portable RF clocks by one factor of ten in both short- and long-term stabilities, which would translate to an Allan deviation of $\sim1\times10^{-13}$ at 1 second and $\sim1\times10^{-15}$ at 1 day. The stability of the optical atomic clock 200 is determined by taking an Allan deviation, which provides clock performance as a fractional frequency instability for different averaging times. Here, the embodiments herein extend the range of integration to longer timescales and provide a corresponding reduction of long-term instability, approaching the level of $1\times10^{-15}$. In order to achieve this level of performance, the embodiments herein utilize tight control over the vapor density and laser power, both of which are further described below, together with a full stability budget for the frequency standard.

As such, the optical atomic clock 200 removes the cavity stabilization system and its associated costs to size, complexity, and mechanical tolerance while also improving the fractional frequency stability by an order of magnitude. The optical atomic clock 200 allows the two-photon rubidium system to be used for the purposes of timekeeping in mobile systems that have constraints on size, weight, power, and environmental robustness, while still delivering good phase noise performance. Accordingly, the embodiments herein provide for a compact optical atomic clock 200 for both terrestrial and space-based applications, including next-generation low-noise oscillators and GPS clocks, according to various examples.

Figure 6E:
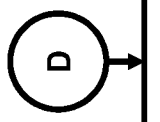
FIG. 6E is a flow diagram illustrating a method of stabilizing the power of a light beam, according to an embodiment herein.

FIGS. 6A through 6F, with reference to FIGS. 1 through 5B, is a flow diagram illustrating a method 300 for providing a frequency standard, according to an embodiment herein. As shown in FIG. 6A, the method 300 comprises providing (305) a light beam 30 at a predetermined frequency; splitting (310) the light beam 30; generating (315) an optical beat note 31 from the light beam 30 using a frequency comb device 40; modulating (320) the frequency of the light beam 30; suppressing (325) a residual amplitude modulation of the light beam 30; performing (330) a second harmonic generation of the light beam 30; performing (335) a two-photon transition of rubidium atoms 90 in a vapor cell 80 to generate a fluorescence signal 100 from the light beam 30; stabilizing (340) a frequency of the light beam 30 to remain on a resonance frequency of the two-photon transition of the rubidium atoms 90; and detecting (345) a repetition rate output of the frequency comb device 40.

Figure 6F:
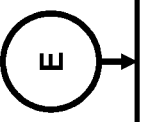
FIG. 6F is a flow diagram illustrating a method of stabilizing the frequency of a fluorescence signal, according to an embodiment herein.

As shown in FIG. 6B, the method 300 may comprise using (350) multiple spatially dislocated light beams 30 to increase an interaction of the rubidium atoms 90 with the light beams 30. As shown in FIG. 6C, the method 300 may comprise detecting (355) colors of the fluorescence signal 100 other than at a wavelength of 420 nm. As shown in FIG. 6D, the method 300 may comprise applying (360) a AC Stark shift cancellation laser to the light beam 30; using (365) an atom fluorescence detector 230 to monitor a laser power of the fluorescence signal 100; and simultaneously modulating (370) the laser power and frequency of the fluorescence signal 100, wherein a frequency shift of the fluorescence signal 100 and the AC Stark shift are equal. As shown in FIG. 6E, the method 300 may comprise stabilizing (375) a power of the light beam 30 prior to delivery into the vapor cell 80 at approximately 30 mW, wherein the light beam 30 is delivered into the vapor cell 80 at a wavelength of approximately 778 nm. As shown in FIG. 6F, the method 300 may comprise stabilizing (380) a fractional frequency of the light beam 30 to $1\times10^{-15}$ at one day.

The instability of the optical atomic clock 200 refers to how much the frequency fluctuates. There may be several sources of clock instability to the Rb two-photon system including AC Stark shift, Zeeman shift, Collisional shift, as well as other factors, which are discussed below. Particular importance is paid to rigorously determining the relevant sensitivity coefficients. Because the embodiments herein provide for a stable frequency standard but not necessarily one with high accuracy, the precise measurement of the magnitude of each systematic effect is not considered, but rather to the descriptions below characterize the stability requirements of external parameters such as magnetic field and laser power. Table I summarizes all of the clock shifts and environmental stability parameters necessary to achieve fractional frequency instabilities of $1\times10^{-15}$.

TABLE I

Environmental variables impacting $^{87}$Rb clock performance

| Shift | Fractional Coefficient | Stability at One Day |
|---|---|---|
| 778 nm AC Stark | $4.8 \times 10^{-13}$/mW | 2.1 µW |
| RB density | $1.1 \times 10^{-12}$/K | 0.92 mK |
| Blackbody Radiation | $1.3 \times 10^{-15}$/K | 770 mk |
| DC Stark | $5.9 \times 10^{-15}$/(V/cm)$^2$ | 0.17 (V/cm)$^2$ |
| 2$^{nd}$ Order Doppler | $1.0 \times 10^{-15}$/K | 1.0K |
| Zeeman | $6.5 \times 10^{-11}$/G$^2$ | 3.9 mg |
| Helium Collisional | $2.7 \times 10^{-8}$/Torr | $3.6 \times 10^{-8}$/Torr |

AC Stark Shift

Two-photon transitions are well-known to suffer from sizable AC Stark shifts associated with the probe laser. The fractional AC Stark shift is given by:

$$\frac{\Delta \nu}{\nu_0} = \frac{\Delta \alpha}{2c\epsilon_0 \hbar}\overline{I(r)} = k(w_0)P, \quad (1)$$

where $\overline{I(r)} \propto P/w_0^2$ is the spatially-averaged laser intensity, P is the one-way optical power incident on the vapor, $\nu_0 \approx 385$ THz is the two-photon laser frequency, $w_0$ is the $1/e^2$ intensity radius, $\Delta\alpha$ is the differential polarizability of the two clock states at 778.1 nm and c, $\epsilon_0$, and h are the speed of light, permittivity of free space and Planck's constant, respectively.

Figure 7A:
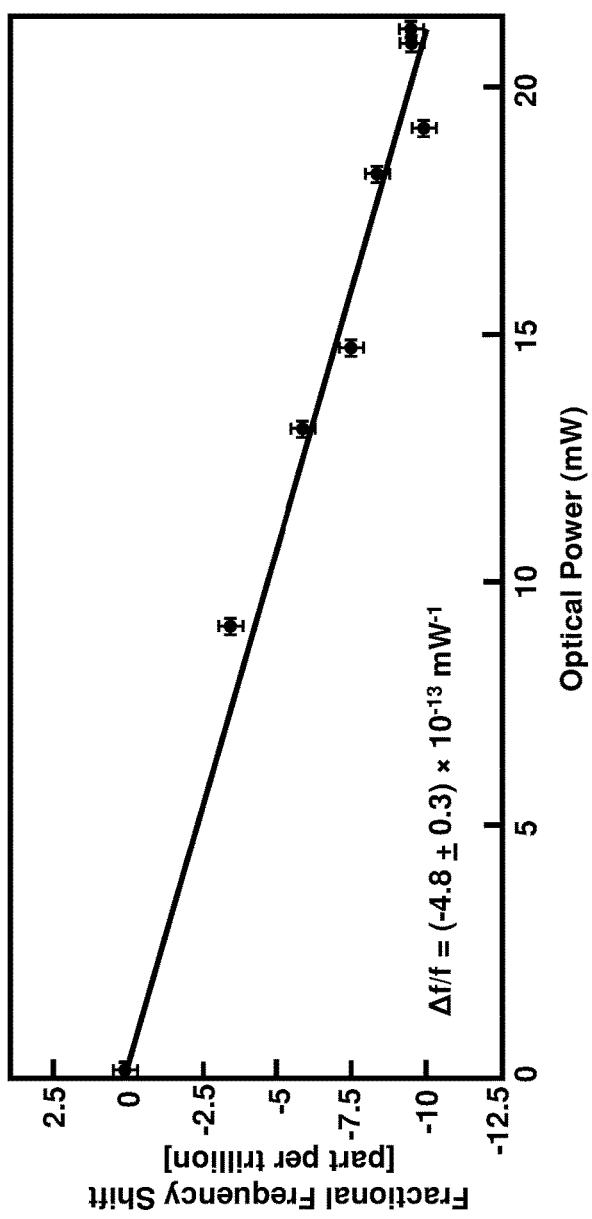
FIG. 7A is a graphical representation illustrating an experimentally measured 778 nm AC Stark shift for a (0.66±0.05) mm laser beam, according to an embodiment herein.
Figure 7B:
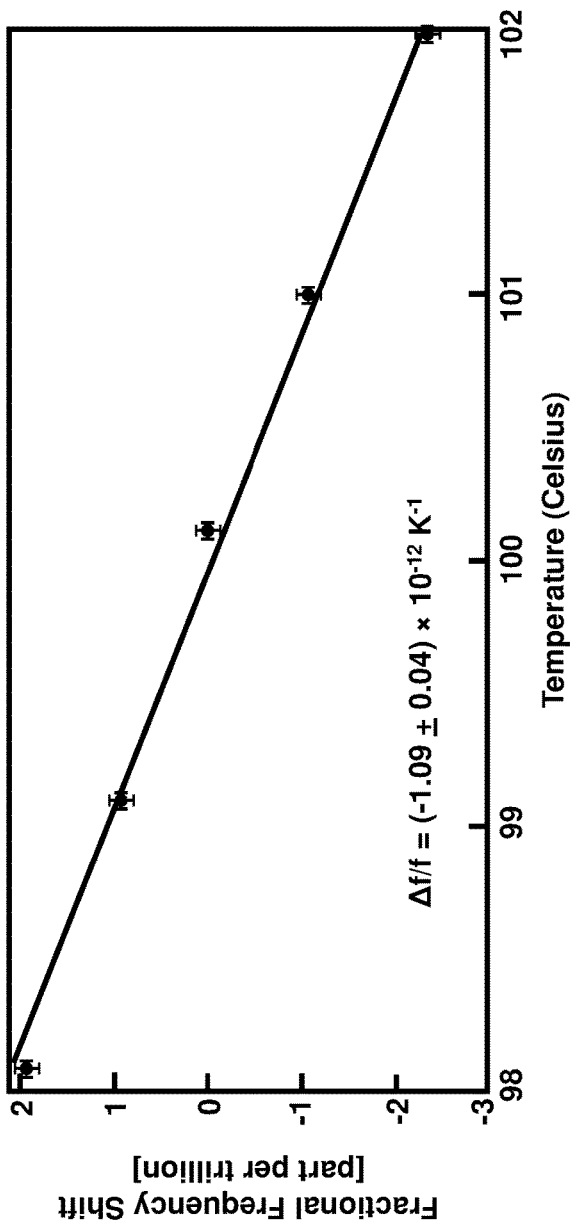
FIG. 7B is a graphical representation illustrating experimentally measured RB collisional shifts, according to an embodiment herein.

The shift was experimentally measured utilizing the clock laser (i.e., light beam 30) together with an external Ti:sapphire laser. The Ti:sapphire laser was tuned slightly away from the two-photon resonance by 2.6 GHz to an optical frequency of 385287.8 GHz, far enough detuned to induce no measurable excitation of the vapor, yet near enough to not significantly change the polarizability. The two lasers were combined by a 50:50 beamsplitter and coupled into a single mode fiber, thereby enforcing the same spatial mode. Without changing the fluorescence signal size, which would contaminate the Stark shift measurement via lock point fluctuations, the power of the detuned laser was varied, and the associated shift was measured. The results of this measurement are shown in FIG. 7A, with reference to FIGS. 1 through 6F along with a linear regression used to determine the sensitivity coefficient $k(w_0)$. The measured fractional clock shift coefficient is $4.8\times10^{-13}$/mW for $w_0$=0.66 µm.

Figure 8:
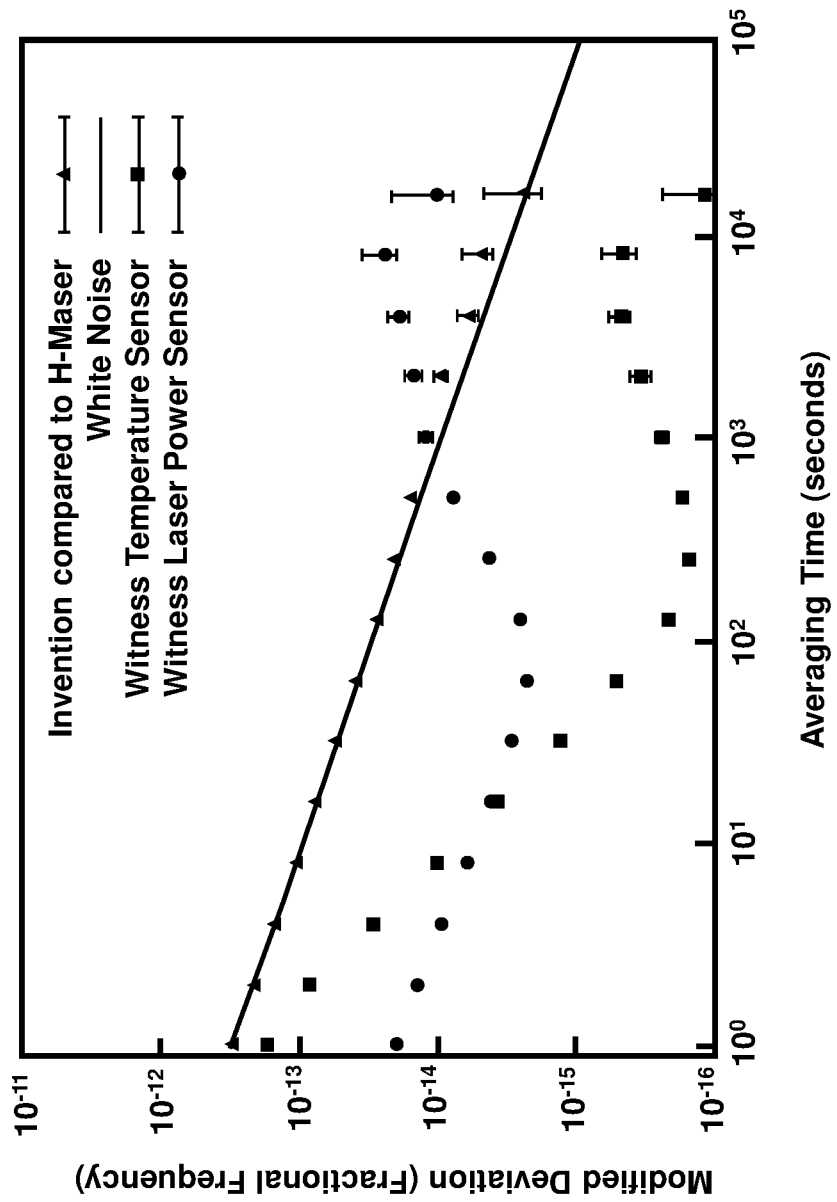
FIG. 8 is a graphical representation illustrating the fractional frequency instability plotted as a Total Modified Allan deviation for $^{87}$Rb with $1/\sqrt{\tau}$ white noise as well as anticipated limits on the clock stability arising from cell temperature fluctuations and laser power fluctuations, according to an embodiment herein.

A standard measurement appropriately scaled to match the beam radius provides a coefficient of $4.5\times10^{-13}$/mW, which agrees well within the error bars of the two experimental measurements. This coefficient indicates that the optical power must be stabilized to 2.1 µW to achieve $1\times10^{-15}$ clock instability, requiring a precise laser power controller 110. The apparatus 10 as shown in FIG. 2 uses feedback of the fluorescence signal 100 to the fiber-optic variable optical attenuator 26 (driven by PID controller 49), which supports a loop bandwidth of 1 kHz. It was discovered that it was most effective to use the fluorescence signal 100 detected on the photomultiplier tube 160 as the laser power sensor, rather than a sampled beam measured on a photodiode 250, although the latter may be used as an out-of-loop witness sensor. This out-of-loop data may be used to determine the fractional clock limitation imposed by laser power instability as shown in FIG. 8, with reference to FIGS. 1 through 7B.

Zeeman Shift

Stray magnetic fields are an important environmental variable that can produce substantial atomic frequency shifts. The magnetic field shift in the incomplete Paschen-Bach regime of the $5S_{1/2}$ ground state can be analytically calculated utilizing the Briet-Rabi formula. Because the spectroscopic technique provided by the embodiments herein does not resolve transitions between specific magnetic sublevels, the experimental process then averages over all relevant $m_I$ and $M_J$ magnetic quantum numbers. This assumption results in no first-order (linear) dependence of the clock frequency on magnetic field, and is valid for local magnetic fields approximately <100 mG, which is roughly the field at which Zeeman-induced line-broadening exceeds the natural linewidth of the two-photon transition. Substitution of the Landé g-factors, $g_J$ and $g_I$ and the magnetic dipole constant from standard calculations yields a second order state shift of 114 Hz/G$^2$ for $^{87}$Rb (F=2) and 358 Hz/G$^2$ for $^{85}$Rb (F=3). The clock shift for the $^5D_{5/2}$ excited state does not have a simple analytical solution. The Hamiltonian:

$$H = H_{hfs} + H_B^{(hfs)},$$

$$H_{hfs} = A_{hfs}\frac{I \cdot J}{\hbar^2} + B_{hfs}\frac{\frac{3}{\hbar^2}(I \cdot J)^2 + \frac{3}{2\hbar}(I \cdot J) - J(J+1)I(I+1)}{2I(2I-1)J(2J-1)},$$

$$H_B^{(hfs)} = \mu_B(g_J J_z + g_I I_z)B,$$

where, I is the nuclear spin, J is the total angular momentum, µB is the Bohr magneton and B is the applied magnetic field, was generated and diagonalized numerically.

Figure 9:
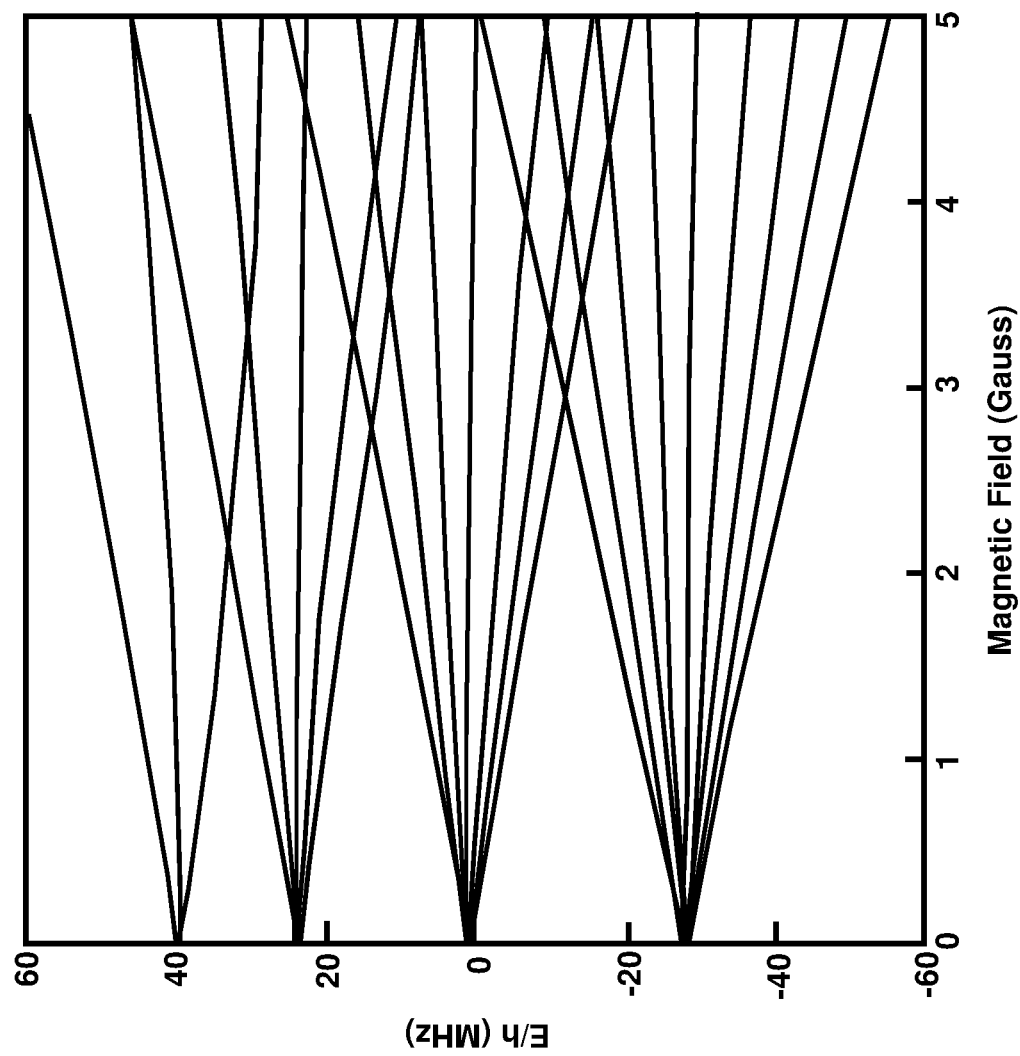
FIG. 9 is a graphical representation illustrating the magnetic field splitting for the $5D_{5/2}$ states of $^{87}$Rb, according to an embodiment herein.

Substituting the magnetic dipole and quadrupole constants, $A_{hfs}$ and $B_{hfs}$, for the $5D_{5/2}$ level results in a state shift of 50 kHz/G$^2$ for $^{87}$Rb (F=4) and 190 kHz/G$^2$ for $^{85}$Rb (F=5). Expressing the differential Zeeman sensitivities in fractional frequency units, this yields the net clock shifts to be $6.5\times10^{-11}$/G$^2$ for $^{87}$Rb and $2.5\times10^{-10}$/G$^2$ for $^{85}$Rb. The energy level splitting diagram for the exited state of $^{87}$Rb is shown in FIG. 9, with reference to FIGS. 1 through 8. With these coefficients, the magnetic shielding requirements may be specified; for $^{87}$Rb ($^{85}$Rb), the magnetic field should be stable at the 3.9 mG (2.0 mG) level. A rectangular µ-metal magnetic shield 180 having a thickness of 5 mm for which the expected shielding factor exceeds 1000, may be utilized. The shielding factor is reduced to due to openings for the heat pipes, optical fiber, electrical cabling, and photomultiplier tube, but it is expected that the residual magnetic field at the vapor cell 80 is approximately <1 mG.

Collisional Shift

The temperature of the vapor cell 80 may be determined using a standard 100 ohm resistive temperature detector (RTD) four wire measurement, with a duplicate device for out-of-loop monitoring. Two independent temperature control stages were utilized experimentally; a 333 K plate (temperature Stage 1 in FIG. 2, to provide a stable reference temperature for heat transfer control, and a second, more finely controlled 373 K stage (temperature Stage 2) upon which the vapor cell was mounted. These stages may be separated by four G-11 fiberglass posts to provide conductive thermal isolation. A precision temperature controller was experimentally used to regulate a thermoelectric device and closed the temperature servo loops. Fiberglass insulation was added around the temperature control stages to reduce convective heat loss.

Experimentally, a collisional shift for the $^{87}$Rb enriched vapor cell 80 was measured by varying the temperature of the vapor cell 80. For each temperature change the vapor cell 80 was allowed to thermalize, whereupon the resulting frequency shift was measured over 300 s. The obtained frequency vs. temperature is plotted in FIG. 7B, with reference to FIGS. 1 through 7A, and the fit supports a clock shift of $-1.09 \times 10^{-12}$/K, which is a factor of two larger than reported for $^{85}$Rb by previous studies in a vapor cell with natural Rb. At 373 K the temperature must be stable to 0.92 mK to achieve fractional frequency stability of $1 \times 10^{-15}$. The fractional clock limitation caused by the temperature fluctuations of temperature Stage 2, measured by the out-of-loop RTD, is shown in FIG. 8.

The vapor cell assembly 80 utilizes the photodiode 250 for use in laser power stabilization that is thermally anchored to temperature Stage 2 for reduction of temperature influenced drifts. In some respects, the photomultiplier tube 160 used for fluorescence detection offers an improved measure of the average laser power across the atomic cloud because it relies on an atomic based signal rather than a beam sampling optic, for which the reflectivity is subject to polarization and temperature variations.

Other Factors

A frequency modulation technique utilizing a phase modulator is typically employed to lock the laser (e.g., light beam 30) to the Rb $5S_{1/2} \rightarrow 5D_{5/2}$ two-photon transition. This technique is known to suffer from residual amplitude modulation (RAM) that arises when modulation sidebands are not equal in magnitude or opposite in phase. Some conventional techniques suppress both in-phase and quadrature RAM utilizing a feedback control of the phase modulator's DC bias and temperature, respectively. The embodiments herein incorporate an in-phase and quadrature RAM suppression technique using a single feedback loop to the DC bias voltage, supporting a loop bandwidth of 10 kHz, which may be combined (by mixer 54) with a sinusoidal modulation signal 28 on a bias tee 140 as shown in FIG. 2. Experimentally, this technique yields suppression of >35 dB. Additionally, in an example, the technique may saturate the input to the 1556 nm optical erbium-doped fiber amplifier 24, which provides a passive reduction of RAM of >5 dB. While these two suppression mechanisms may be sufficient to achieve fractional clock instabilities shown in FIG. 8, further corrections to quadrature RAM could be implemented by stabilizing the temperature of the electro-optic modulator 60 to further decrease clock instabilities.

Doppler effects are largely eliminated by retro-reflecting the laser (e.g., light beam 30) that passes through the vapor cell 80. However, residual broadening related to the absorption of two-photons from the same beam remains, wherein this contribution to the lineshape is a Gaussian function with a full-width at half-maximum of $\sqrt{8k_B T \ln 2 / mc^2 v_0} \approx 571$ MHz for $^{87}$Rb at T=373 K, with $k_B$ the Boltzmann constant, and m the atomic mass. Absorbing two photons from the same light beam occurs with the same probability as absorbing one photon from each beam; however, the linewidth associated with the former process is 1000 times greater than the latter. Hence, the Doppler-broadened peak is not easily resolved, and residual Doppler effects are small.

The significant tails of the Lorentzian peaks of neighboring hyperfine transitions pull the spectral lines closer together, a phenomenon known as line-pulling. The amount by which a particular transition is shifted is calculated by summing over all relevant hyperfine Lorentzians with appropriate frequencies and strengths. The two-photon transition is shifted by 0.477 Hz for $^{85}$Rb and 0.030 Hz for $^{87}$Rb, according to the experimental calculations.

Second-order Doppler broadening, taking into account first order relativistic corrections, is given by:

$$\frac{\delta w}{w} = \frac{\bar{v}^2}{2c^2}, \quad (2)$$

where $\bar{v}^2 = 8k_B T / m\pi$. For Rb at 373 K the fractional clock shift is $5 \times 10^{-13}$ with a slope of $1 \times 10^{-15}$/K.

The atomic vapor is immersed in a bath of electromagnetic radiation whose spectrum follows Planck's Law. In many cases, the blackbody radiation (BBR) shift can be treated as a DC Stark shift, since the radiation is far off resonance from all relevant atomic transitions. However, the operational temperature, 373 K, of the optical atomic clock 200 yields a blackbody spectrum that is nearly resonant with several transitions connecting to the $5D_{5/2}$ state. The fractional clock shift arising from BBR is $1.3 \times 10^{-15}$/K requiring that the blackbody source be held to temperatures more stable than 770 mK.

The DC polarizability of the $5D_{5/2}$ state provided in previous measurements in the literature exceeds that of the $5D_{1/2}$ state by a factor of ~50 due to low-lying transitions to nearby levels. Using this polarizability, the experimental calculation techniques provide that the fractional clock sensitivity to DC electric fields is $5.9 \times 10^{-15}$/(V/cm)$^2$. The magnetic shield 180 surrounding the vapor cell assembly 80 also acts as a Faraday cage to prevent external electric fields from reaching the atomic vapor in the vapor cell assembly 80. However, stray charge could accumulate on the glass vapor cell itself, and any resulting patch potentials should be stable at the 0.5 V level.

Experimentally determined collisional shifts for various noble gases were examined to put limits on vapor cell impurities. Helium is the only gas known to permeate the vapor cell 80, and it produces frequency shifts of −2.1 MHz/Torr. Therefore, a helium leak rate of $<3.6 \times 10^{-8}$/Torr/day should be achieved in order to achieve fractional clock instabilities below $1 \times 10^{-15}$. The vapor cell 80 may also be permeable to methane, which has an atmospheric composition of about three times less than helium.

Short Term Stability

The practical noise limit of a frequency standard is the greater of the local oscillator noise and the shot noise limit of the atoms or the photons used to detect those atoms. The Allan deviation, limited by shot noise can be written as:

$$\sigma_y^{(SN)} = \frac{1}{v_0} \sqrt{\frac{S_f}{2\tau}}, \quad (3)$$

where, $$S_f = \left(\frac{g}{p}\right)^2 \frac{S_v}{2}, \quad (4)$$

g is the mixer gain, p is the error signal slope in Hz/V, $S_v$ is the voltage spectral density, and $v_0$ is the transition frequency. For the optical atomic clock 200, some example parameters to calculate the shot noise limit are shown in Table II, which may yield a shot noise limit of $4.6 \times 10^{-13}/\sqrt{\tau}$.

TABLE II

Signal parameters

| Parameter | Value |
|---|---|
| Mixer gain (g) | 0.41 |
| Error signal slope (p) | 9.56 V/Hz |
| Voltage spectral density ($S_v$) | $6.9 \times 10^{-9}$ V²/Hz |

The Allan deviation, limited by local oscillator noise can be written as:

$$\sigma_y^{(SN)} = \frac{S_y^{(LO)}[2f_m]}{2\sqrt{\tau}}, \quad (5)$$

where, $f_m$ is the modulation frequency and $S_y^{(LO)}$ is the power spectral density of the local oscillator's fractional frequency noise. The power spectral density of the seed laser (i.e., light beam 30) used at twice the modulation frequency yields a limit of $2.6 \times 10^{-14}/\sqrt{\tau}$.

Having assessed the leading contributions to instability, the experimental technique next measures the clock performance by collecting the comb repetition rate and compared the phase noise to the hydrogen maser 51 to determine the clock stability. During data collection, the temperature of the vapor cell 80 and 778 nm laser power were monitored. The phase comparison was sampled at a rate of 1 Hz before being converted to frequency data, from which a linear drift of $-8 \times 10^{-19}$/s was removed. FIG. 8 shows the resulting total modified Allan deviation of the apparatus 10, as well as the expected clock performance limitations derived from out-of-loop measurements of the cell temperature and laser power. Clock performance exceeds expected stability as calculated from laser power measurements, however, long term laser power measurements from the photodiode 250 are thought to be partially influenced by room temperature fluctuations, whereby these temperature variations may lead to an overestimate of Stark shift-related clock instability. As shown in FIG. 8, the Rb two-photon frequency standard operates with a fractional frequency instability $3 \times 10^{-13}/\sqrt{\tau(s)}$ for $\tau$ from 1 s to 10,000 s.

The experimental measurements demonstrate that the apparatus 10 and optical atomic clock 200 are capable of averaging down less than $4.6 \times 10^{-15}$ at 16,000 s. While the experimental data has been limited for timescales beyond this, it can be seen that the clock instability increases on longer timescales. It appears that this performance degradation is related to the AC Stark shift, which would indicate that tighter control and better measurement of the laser power may be utilized to achieve fractional frequency instabilities of $1 \times 10^{-15}$ at one day.

The embodiments herein provide an optical frequency standard that is suitable for an array of both terrestrial and space-based applications. Accordingly, the optical atomic clock 200 based upon a two-photon transition at 778 nm in rubidium atom 99 (e.g., vapor) is an ideal candidate to meet the requirements of GNSS applications, as well as being a viable option for other applications. For example, the embodiments herein provide an optical rubidium atomic frequency standard for an optical atomic clock 200, which may be implemented in a variety of applications such as advanced network systems, navigations systems, communication systems, as well as telescope array systems, and provides improved clock stability over conventional radio frequency technologies. The optical atomic clock 200 may be configured to have a small footprint (e.g., approximately 30 L volume), weight (e.g., approximately 20 kg), and power requirements (e.g., approximately 30 W), thereby facilitating its use in several types of devices and components.

The environmental sensitivity provided by the embodiments herein is unique over the conventional frequency standards used in GNSS. Specifically, the fractional magnetic field sensitivity scales inversely as the carrier frequency; therefore, with the optical carrier frequency for this transition being roughly 50,000 times larger than typical RF clocks, minimal magnetic shielding is required for the optical atomic clock 200 provided by the embodiments herein.

The optical atomic clock 200 provided by the embodiments herein achieves improved speed; i.e., the clock 200 achieves improved time for the light beam 30 to interact with the atoms 90 to be detected, and to be used successfully to correct the laser (the loop bandwidth), and is significantly faster than the conventional atomic clocks. The time scale is 10 microseconds, and thus the clock 200 can remove negative effects such as vibrations faster than other clocks and therefore maintain operation through dynamic conditions.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. An apparatus comprising:
    a laser source to generate a light beam at a predetermined frequency;
    a frequency comb device to generate an optical beat note from a first portion of the light beam;
    an optical waveguide to modulate a phase of a second portion of the light beam, wherein the optical waveguide comprises a fiber-coupled electro-optic modulator, and wherein residual amplitude modulation is suppressed in the optical waveguide;
    an erbium doped fiber amplifier to amplify the frequency of the second portion of the light beam;
    a vapor cell assembly comprising rubidium atoms, the vapor cell assembly configured to perform a two-photon transition of the rubidium atoms to generate a fluorescence signal from the second portion of the light beam;

a controller to lock a frequency of the fluorescence signal to a resonance frequency of the two-photon transition of the rubidium atoms;
a frequency counter to count the optical beat note; and
a processor to compare the locked frequency of the fluorescence signal to the optical beat note.

2. The apparatus of claim 1, comprising a voltage source to apply a DC offset voltage to the electro-optic modulator.

3. The apparatus of claim 1, comprising:
an optical filter to filter a portion of the fluorescence signal; and
a photomultiplier tube in conjunction with a current pre-amplifier to detect a magnitude of the portion of the fluorescence signal filtered by the optical filter.

4. The apparatus of claim 1, comprising a magnetic shield comprising dual-zone temperature regions surrounding the vapor cell assembly.

5. The apparatus of claim 1, comprising a thermo-generating device to heat the vapor cell assembly to approximately 100° C.

6. The apparatus of claim 1, wherein the photomultiplier tube and the current pre-amplifier are configured to monitor laser power of the portion of the fluorescence signal filtered by the optical filter.

7. The apparatus of claim 1, comprising a splitter to split the light beam into the first portion and the second portion.

8. An optical atomic clock comprising:
a fiber-coupled electro-optic modulator to phase modulate and suppress residual amplitude modulation of a frequency-doubled laser;
a rubidium-enriched vapor cell configured to perform a two-photon transition of rubidium atoms to generate a fluorescence signal from the laser;
a differential lock mechanism to stabilize a frequency of the fluorescence signal to a resonance frequency of the two-photon transition of the rubidium atoms; and
a photodiode to detect the residual amplitude modulation of the laser, wherein the electro-optic modulator is to undergo voltage biasing to remove the residual amplitude modulation of the laser.

9. The optical atomic clock of claim 8, comprising:
a detector to detect a magnitude of the fluorescence signal; and
a retro-reflector that is positioned facing the detector.

10. The optical atomic clock of claim 9, wherein the detector is to detect light comprising an optical wavelength of approximately 776 nm emitted from the rubidium atoms.

11. An optical atomic clock comprising:
a fiber-coupled electro-optic modulator to phase modulate and suppress residual amplitude modulation of a frequency-doubled laser;
a rubidium-enriched vapor cell for performing a two-photon transition of rubidium atoms to generate a fluorescence signal from the laser; and
a differential lock mechanism for stabilizing a fractional frequency instability of the laser to $1\times10^{-13}$ at one second.

12. A method comprising:
providing a light beam at a predetermined frequency;
splitting the light beam;
generating an optical beat note from the light beam using a frequency comb device;
modulating the frequency of the light beam;
suppressing a residual amplitude modulation of the light beam;
performing a second harmonic generation of the light beam;
performing a two-photon transition of rubidium atoms in a vapor cell to generate a fluorescence signal from the light beam;
stabilizing a frequency of the light beam to remain on a resonance frequency of the two-photon transition of the rubidium atoms; and
detecting a repetition rate output of the frequency comb device.

13. The method of claim 12, comprising using multiple spatially dislocated light beams to increase an interaction of the rubidium atoms with the light beams.

14. The method of claim 12, comprising detecting colors of the fluorescence signal other than at a wavelength of 420 nm.

15. The method of claim 12, comprising applying a AC Stark shift cancellation laser to the light beam.

16. The method of claim 15, comprising using an atom fluorescence detector to monitor a laser power of the fluorescence signal.

17. The method of claim 16, comprising simultaneously modulating the laser power and frequency of the fluorescence signal, wherein a frequency shift of the fluorescence signal and the AC Stark shift are equal.

18. The method of claim 12, comprising stabilizing a power of the light beam prior to delivery into the vapor cell at approximately 30 mW, wherein the light beam is delivered into the vapor cell at a wavelength of approximately 778 nm.

19. The method of claim 12, comprising stabilizing a fractional frequency of the light beam to $1\times10^{-15}$ at one day.

* * * * *